(12) United States Patent
Yoshida et al.

(10) Patent No.: US 9,015,508 B2
(45) Date of Patent: Apr. 21, 2015

(54) SEMICONDUCTOR DEVICE AND AUTOMOBILE CONTROL SYSTEM

(75) Inventors: Satoshi Yoshida, Kanagawa (JP); Nobuyuki Kurosawa, Kanagawa (JP); Kenta Sasaki, Itami (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 645 days.

(21) Appl. No.: 13/316,474

(22) Filed: Dec. 10, 2011

(65) Prior Publication Data

US 2012/0161833 A1 Jun. 28, 2012

(30) Foreign Application Priority Data

Dec. 22, 2010 (JP) .................................. 2010-286263

(51) Int. Cl.
*G06F 1/32* (2006.01)
*G06F 1/04* (2006.01)
*G06F 15/78* (2006.01)

(52) U.S. Cl.
CPC . *G06F 1/04* (2013.01); *G06F 15/78* (2013.01)

(58) Field of Classification Search
USPC .......................... 713/322, 323, 601; 327/156
See application file for complete search history.

(56) References Cited

U.S. PATENT DOCUMENTS

| 6,686,802 | B2 | 2/2004 | Maeda | |
|---|---|---|---|---|
| 7,444,529 | B2* | 10/2008 | Matsuoka et al. | ............ 713/322 |
| 2006/0069933 | A1* | 3/2006 | Matsuoka et al. | ............ 713/300 |

FOREIGN PATENT DOCUMENTS

| JP | 2003-177834 A | 6/2003 |
|---|---|---|
| JP | 2006-127466 A | 5/2006 |
| JP | 2006-287736 A | 10/2006 |
| JP | 4216282 B2 | 11/2008 |

* cited by examiner

*Primary Examiner* — M Elamin
(74) *Attorney, Agent, or Firm* — Miles & Stockbridge P.C.

(57) ABSTRACT

Even after power-down, distinction between a transition from a PLL normal-oscillation state and a transition from a PLL self-oscillation is allowed.
A semiconductor device includes a first region which, after having transited from a power-supply state to a power-down state, returns to the power-supply state again, a second region which holds a power source voltage regardless of power-down of the first region, and an oscillator which generates a first clock signal supplied to the first region. The first region includes a PLL circuit. The second region includes an information holding unit capable of holding information which can distinguish whether the operation mode of the PLL circuit is a PLL normal-oscillation mode or a PLL self-oscillation mode, and determines the operation mode of the PLL circuit when the first region has returned from the power-down state to the power-supply state, according to the information held in the information holding unit.

6 Claims, 15 Drawing Sheets

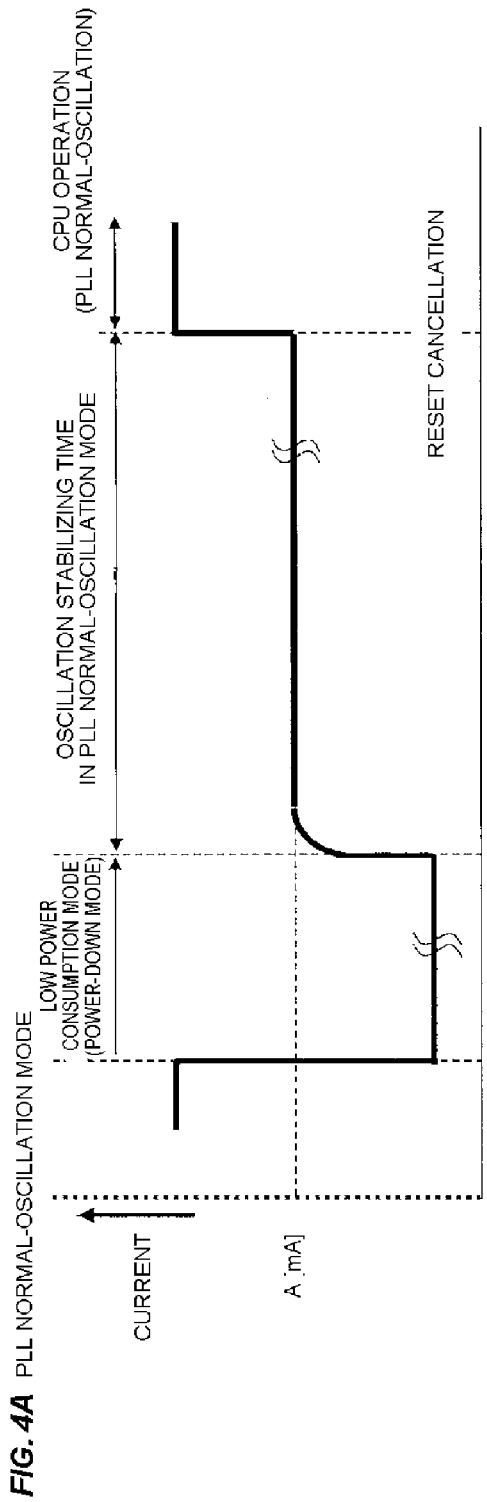
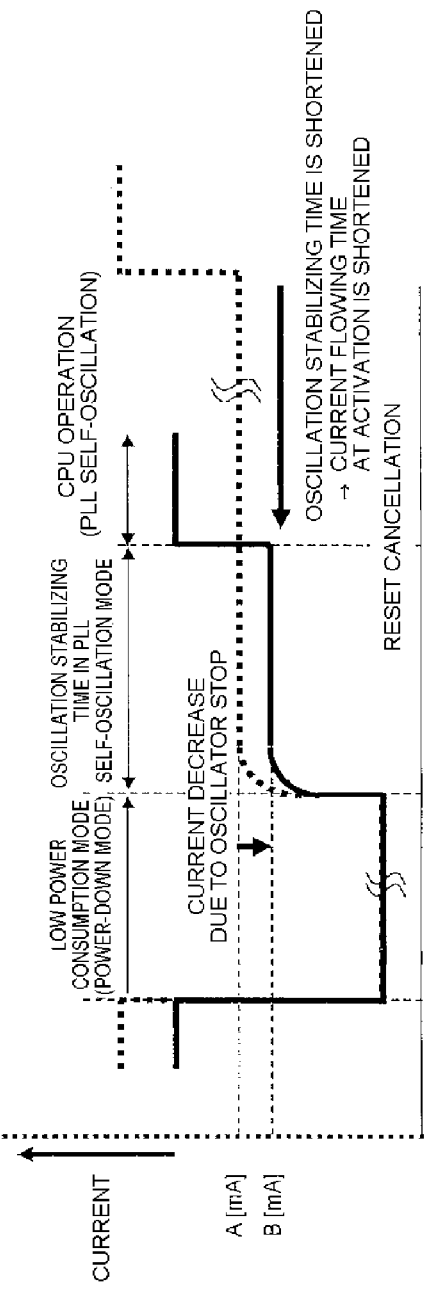
FIG. 4A PLL NORMAL-OSCILLATION MODE
FIG. 4B PLL SELF-OSCILLATION MODE

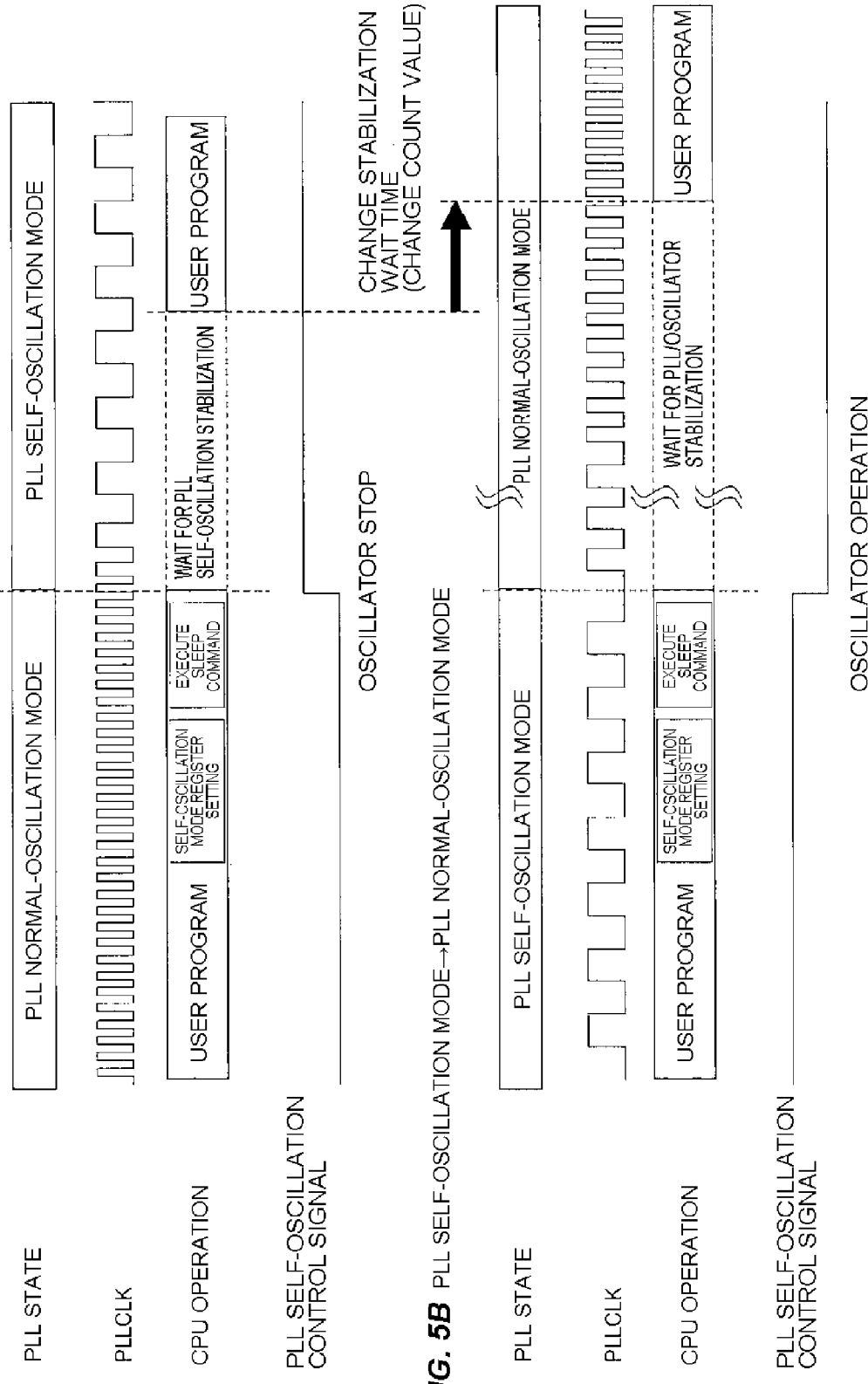

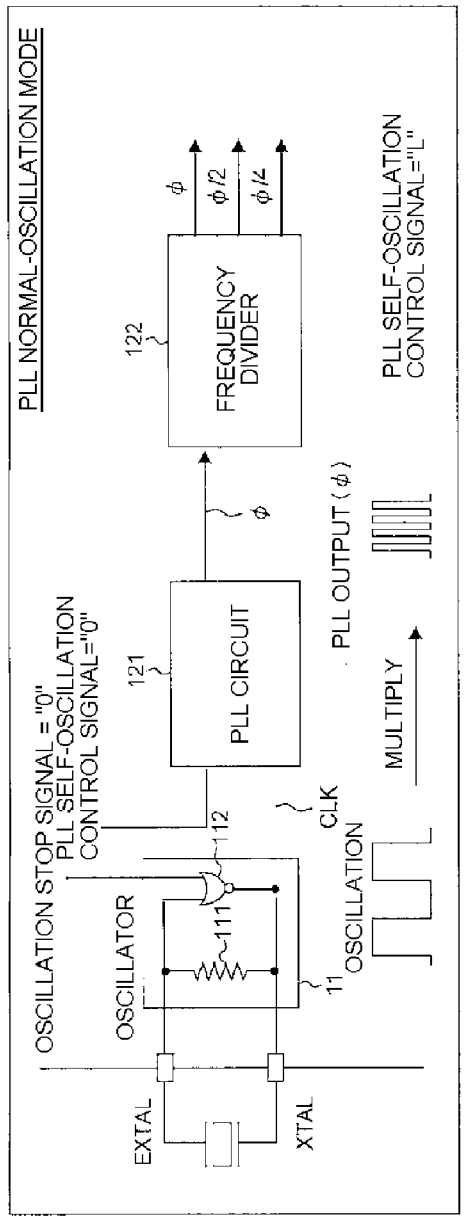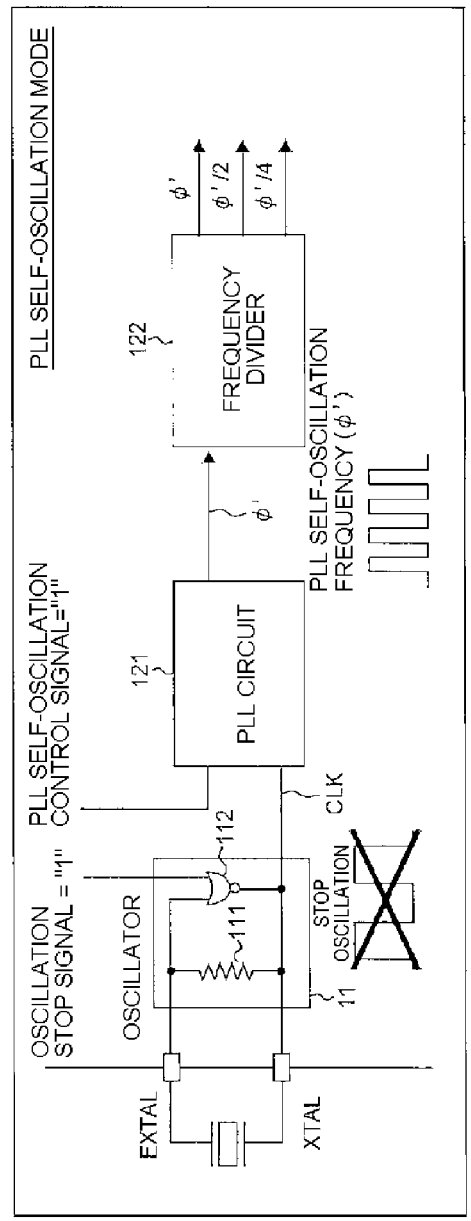

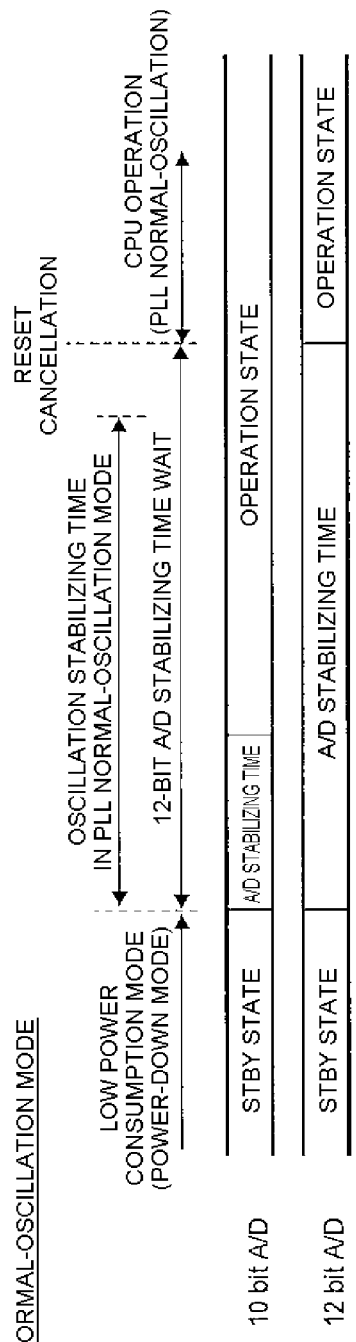
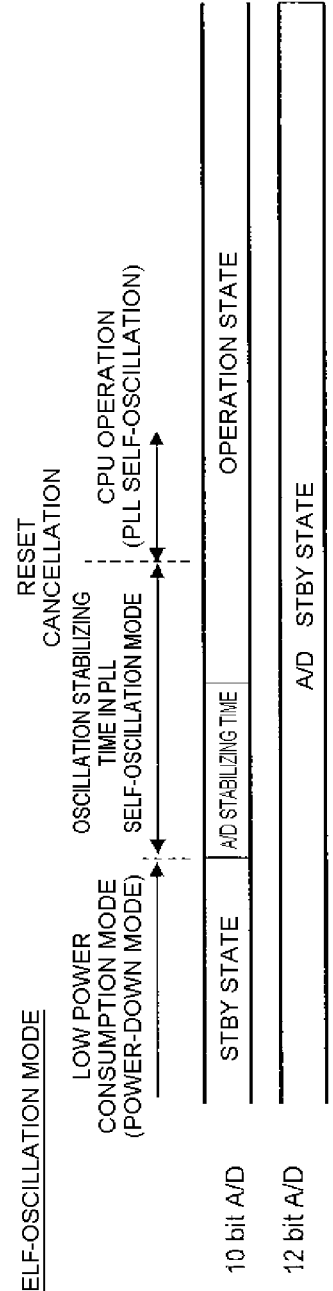
FIG. 9A IN PLL NORMAL-OSCILLATION MODE
FIG. 9B IN PLL SELF-OSCILLATION MODE

SEMICONDUCTOR DEVICE AND AUTOMOBILE CONTROL SYSTEM

CROSS-REFERENCE TO RELATED APPLICATION

The disclosure of Japanese Patent Application No. 2010-286263 filed on Dec. 22, 2010 including the specification, drawings and abstract is incorporated herein by reference in its entirety.

BACKGROUND

The present invention relates to a semiconductor device and an automobile control system having the same, and particularly to a technology for reducing power consumption.

Patent document 1 (Japanese Patent Laid-Open No. 2006-287736) describes a detection circuit and a semiconductor device which can efficiently detect stop of an external clock with a simple circuit configuration. The semiconductor device has a PLL circuit which generates a PLL (Phase-Locked Loop) output clock by multiplying an oscillation clock, an internal circuit which operates based on the PLL output clock, and an oscillation stop detection circuit which detects, based on the oscillation clock and the PLL output clock, stop of the oscillation clock, and outputs the detected result to the internal circuit.

Patent document 2 (Japanese Patent Laid-Open No. 2003-177834) describes a technology for configuring a stop detection unit of an external oscillator circuit with a simple structure and a small circuit footprint. In a microcomputer having a built-in PLL circuit according to the patent document 2, when an output of a counter, which is cleared by an output of an edge detection circuit for detecting an edge of an externally-generated clock signal that is input and which performs a count operation using an internal clock signal output from the PLL circuit as a count source, exceeds a predetermined setting value, it is detected as stop of the externally-generated clock signal and an external clock stop detection signal is output.

Patent document 3 (Japanese Patent No. 4216282) describes a semiconductor integrated circuit device which can reliably prevent malfunction or the like even if any abnormality such as stop of an externally coupled clock oscillator has occurred. According to the patent document 3, the circuit has a clock generating unit which detects the signal state of an oscillation signal generated by an external oscillator externally coupled to an oscillation signal terminal, and generates a clock signal based on an oscillation signal of the external oscillator if the oscillation signal of the external oscillator is normal, or generates a system clock signal based on an internal oscillation signal if the oscillation signal of the external oscillator is abnormal.

Patent document 4 (Japanese Patent Laid-Open No. 2006-127466) describes a microcomputer which stops the oscillator circuit and the PLL circuit upon transiting to a low power consumption mode and starts processing of the CPU faster when the low power consumption mode is canceled. According to the patent document 4, the oscillation condition that has been set at the time of transiting to the low power consumption mode is held, and when the oscillation is resumed, the oscillator circuit is operated based on the held oscillation condition.

SUMMARY

The conventional microcomputers assume no function of freely switching between a state (PLL normal-oscillation mode) in which a clock signal is generated based on an oscillation signal of an external oscillator and a state (PLL self-oscillation mode) in which a system clock signal is generated based on an internal oscillation signal as a function of the normal operation. In addition, operations have neither been assumed nor have been considered necessary, such as transiting from each of the PLL normal-oscillation mode and the PLL self-oscillation mode to a low power consumption mode, or returning from the low power consumption mode to the clock generating state of the PLL (each PLL mode) before transiting to the low power consumption mode.

However, the inventors have examined the operation modes of conventional microcomputers and found the following problems.

Although the microcomputer transits from the PLL normal-oscillation mode to the low power consumption mode (power-down state), current which flows in returning from the power-down state is large, and the stabilization wait time from returning to starting the CPU operation is long. Reducing the average current further in an intermittent operation which repeats alternate transition between the power-down state and the CPU operation needs to reduce the current which flows in returning from the power-down state and the time from the returning to the starting of the CPU operation. In the PLL normal-oscillation state, an input clock signal is multiplied to form an internal operation clock signal. Usually, the oscillator used in the clock generating unit has a long stabilizing time at power-on, and the current which flows in the oscillator is also large. In the PLL self-oscillation state, the PLL has a large jitter, which can not satisfy the specifications of various modules mounted on the microcomputer. As a result of such a consideration, it is desirable to allow switching between the PLL normal-oscillation mode and the PLL self-oscillation mode, so that the microcomputer operates in the PLL self-oscillation mode for applications in which the need to regulate average current during the intermittent operation needs by even relaxing the specifications of various modules, and returns to the PLL self-oscillation mode if the microcomputer has transited from the PLL self-oscillation mode to the low power consumption mode. The following mechanism is considered necessary to realize this.

Since the microcomputer is in the power-down state by the low power consumption mode, it is necessary to distinguish, even after power-down, whether transition is from the PLL normal-oscillation state or from the PLL self-oscillation state. Additionally, when the microcomputer returns from the power-down state, it needs to return to the state before transition. Furthermore, since the stabilizing wait time when the microcomputer returns from the power-down state is different between the PLL normal-oscillation mode and the PLL self-oscillation mode, a function of switching each stabilization wait time is needed to satisfy the demand for lower power consumption.

The purpose of the present invention is to provide a technology which enables, even after power-down, distinction between a transition from a PLL normal-oscillation state and a transition from a PLL self-oscillation and, when the microcomputer returns from the power-down state, ensures that it returns to the state before the transition.

The description of the present specification and the accompanying drawings clarify the other purposes and the new feature of the present invention.

The following explains briefly the outline of a typical invention among the inventions disclosed in the present application.

A semiconductor device has a first region which returns to the power-supply state after it has transited from a power-supply state to a power-down state, a second region which holds a power source voltage regardless of the power-down in the first region, and an oscillator which generates a first clock signal to be supplied to the first region.

The first region includes a PLL circuit having a PLL normal-oscillation mode for generating a second clock signal which synchronizes with the first clock signal that has been generated in the oscillator, and a PLL self-oscillation mode for generating a third clock signal which is asynchronous with the first clock signal.

The second region includes an information holding unit capable of holding information which can distinguish whether the operation mode of the PLL circuit when the first region transits from the power-supply state to the power-down state is the PLL normal-oscillation mode or the PLL self-oscillation mode.

The following explains briefly the effect acquired by the typical invention among the inventions disclosed in the present application.

A transition from a PLL normal-oscillation state and a transition from a PLL self-oscillation can be distinguished from each other, even after the power-down state.

BRIEF DESCRIPTION OF THE DRAWINGS

FIG. 4 is a current waveform chart when the microcomputer returns from the power-down state in a PLL normal-oscillation mode and a PLL self-oscillation mode;

FIG. 5 is an explanatory diagram of a switching sequence between the PLL normal-oscillation mode and the PLL self-oscillation mode;

FIG. 6 is an explanatory diagram of the state of the main part in the PLL normal-oscillation mode and the PLL self-oscillation mode;

FIG. 9 is a control timing chart of the A/D conversion unit;

DETAILED DESCRIPTION

1. Outline of Embodiments

Figure 1:
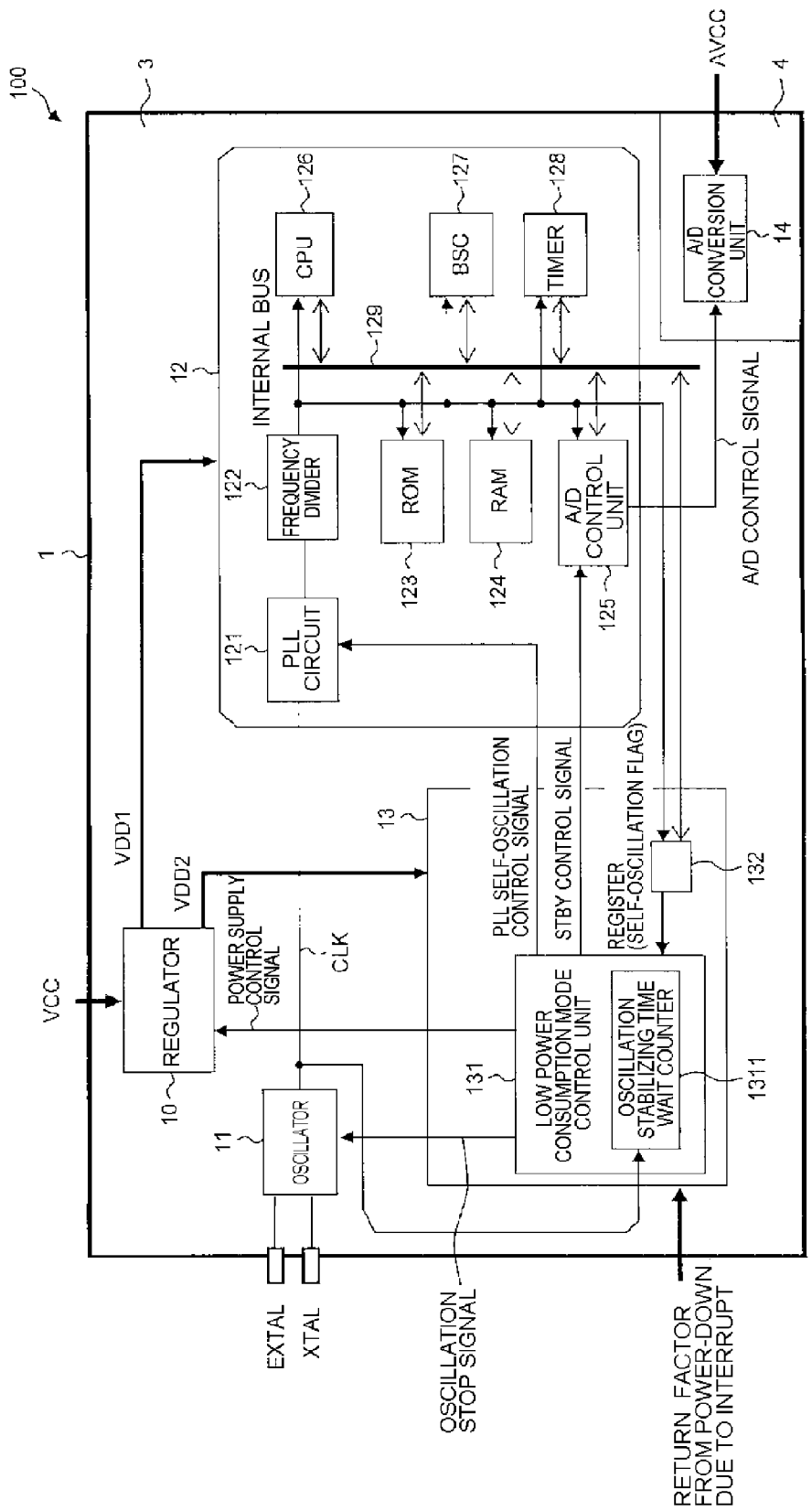
FIG. 1 is an exemplary block diagram of a microcomputer provided as an example of a semiconductor device according to the present invention.

First, representative embodiments of the invention disclosed in the application will be described. Reference numerals in the drawings, referred to with parentheses in the outline explanation of representative embodiments, only illustrate what is included in the concept of the components to which the numerals are provided.

[1] A semiconductor device (1) according to a representative embodiment of the present invention includes a first region (12) which, after having transited from a power-supply state to a power-down state, returns to the power-supply state, a second region (13) which holds a power source voltage regardless of power-down of the first region, and an oscillator (11) which generates a first clock signal supplied to the first region.

The first region (12) includes a PLL circuit (121) having a PLL normal-oscillation mode for generating a second clock signal which synchronizes with the first clock signal generated in the oscillator, and a PLL self-oscillation mode for generating a third clock signal which is asynchronous with the first clock signal.

The second region (13) includes an information holding unit (132) capable of holding information which can distinguish whether the operation mode of the PLL circuit when the first region transits from the power-supply state to the power-down state is the PLL normal-oscillation mode or the PLL self-oscillation mode.

[2] In paragraph [1], it is possible to provide the second region (13) with a control unit (131) which determines, according to the information held in the information holding unit, the operation mode of the PLL circuit when the first region has returned from the power-down state to the power-supply state.

In the above configuration, the initial state at power-on can be started up from the PLL normal-oscillation state of the PLL circuit 121. If lower power consumption is still required, it is possible to switch to the PLL self-oscillation mode. Provision of the information holding unit enables the control unit to distinguish whether the transition is from the PLL normal-oscillation mode or from the PLL self-oscillation mode. Accordingly, it is possible to control the PLL circuit so that the operation mode when it returns from the low power consumption mode is the same as the operation mode immediately before it transits to the low power consumption mode.

[3] In paragraph [2], the control unit may be configured to determine the operation mode of the PLL circuit so that the operation mode of the PLL circuit when the first region transits from the power-supply state to the power-down state is the same as the operation mode of the PLL circuit when the first region returns from the power-down state to the power-supply state.

[4] In paragraph [3], the control unit may be configured so that the oscillator stops when the PLL circuit is regarded to be in the PLL self-oscillation mode.

[5] In paragraph [4], the oscillator may be configured to include an oscillation stop detection circuit which can detect stop of oscillation.

[6] In paragraph [5], the second region may have a register (133) in which whether to enable the oscillation stop detection function by the oscillation stop detection circuit can be set, and a logic gate (134) for disabling, regardless of the setting in the register, the oscillation stop detection function by the oscillation stop detection circuit when the control unit determines that the PLL circuit is in the PLL self-oscillation mode.

[7] n paragraph [6], the second region may have a standby control unit (136) which limits returning of an analog module from a standby state when it returns with the PLL self-oscillation mode, according to the information held in the information holding unit.

[8] In paragraph [7], the semiconductor device may be configured to include a first A/D conversion circuit (141) that converts an analog signal into a digital signal with a first conversion accuracy, and a second A/D conversion circuit (142) that converts an analog signal into a digital signal with a second conversion accuracy which is higher than the first conversion accuracy. The standby control unit causes both the first A/D conversion circuit and the second A/D conversion circuit to return when returning with the PLL normal-oscillation mode, and causes the first A/D conversion circuit to return and keeps the second A/D conversion circuit in the standby state when returning with the PLL self-oscillation mode.

[9] In paragraph [8], the second region may have a first storage unit (1319 and 1320), a second storage unit (1317 and 1318), and an oscillation stabilizing time wait counter (1311), to allow switching the stabilizing wait time in returning from the power-down state between the PLL normal-oscillation mode and the PLL self-oscillation mode. The first storage unit can set an oscillation stabilizing time in the PLL normal-oscillation mode. The second storage unit can set an oscillation stabilizing time in the PLL self-oscillation mode. The selection circuit selects information stored in the first storage unit and information stored in the second storage unit according to the information held in the information holding unit. The oscillation stabilizing time wait counter keeps an oscillation stabilizing time based on the information selected by the selection circuit.

[10] In paragraph [9], an external terminal (1322) may be provided, which can determine, regardless of the information held in the information holding unit, the operation mode of the PLL circuit when the first region has returned to the power-supply state from the power-down state.

[11] An automobile control system (2) can include the semiconductor device configured as described above.

2. Details of Embodiments

Embodiments will be described in detail below.

<<Embodiment 1>>

FIG. 1 illustrates a microcomputer provided as an example of the semiconductor device according to the present invention.

A microcomputer 1 shown in FIG. 1 is formed on a single semiconductor substrate such as a single-crystal silicon substrate by a semiconductor integrated circuit manufacturing technology, without particular limitation.

The microcomputer 1 has a region (referred to as "VCC region") 3 to which a high-potential power supply VCC externally supplied is applied, and a region (referred to as "AVCC region) 4 to which a high-potential power supply AVCC externally supplied is applied. A regulator 10 and an oscillator 11 are formed in the VCC region 3. The regulator 10 generates a first power source voltage VDD1 and a second power source voltage VDD2 which are lower than the high potential side power supply VCC by dropping the high-potential power supply VCC externally supplied. The oscillator 11 generates a clock signal CLK by using a crystal oscillator coupled to external terminals EXTAL and XTAL. An A/D conversion unit 14 is formed in the AVCC region 4. Although not shown in the figures, the A/D conversion unit 14 converts an analog signal that is externally input into a digital signal. A power-down region 12 and a voltage holding region 13 are formed in the microcomputer 1 at the time of power-down, separately from the VCC region 3 described above. The first power source voltage VDD1 generated in the regulator 10 is supplied to the power-down region 12, and the second power source voltage VDD2 generated in the regulator 10 is supplied to the voltage holding region 13.

Figure 2:
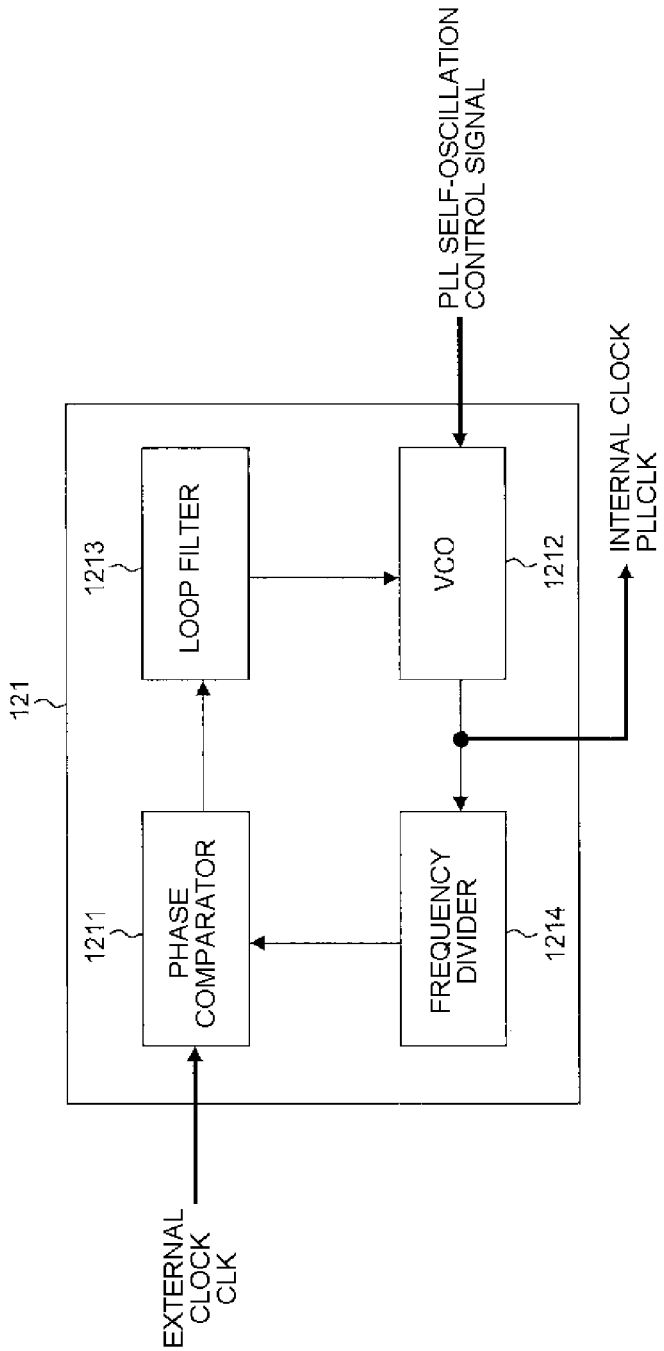
FIG. 2 is an exemplary block diagram of a PLL circuit in the microcomputer shown in FIG. 1.

The power-down region 12 is a region in which supply of the first power source voltage VDD1 is shut down in the low power consumption mode of the microcomputer 1. The power-down region 12 may have a PLL (Phase Locked Loop) circuit 121, a frequency divider 122, a ROM (Read-Only Memory) 123, a RAM (Random Access Memory) 124, an A/D control unit 125, a CPU (Central Processing Unit) 126, a BSC (Bus State Controller) 127, and a timer 128. The ROM 123, the RAM 124, the A/D control unit 125, the CPU 126, the BSC 127, and the timer 128 are coupled so that they can exchange signals with each other via a bus 129. As shown in FIG. 2, the PLL circuit 121 includes a phase comparator 1211, a VCO (Voltage Controlled Oscillator Circuit) 1212, a loop filter 1213, and a frequency divider 1214 to generate an internal clock signal PLLCLK synchronizing with the clock signal CLK transmitted from the oscillator 11. The phase comparator compares the phases of the clock signal CLK transmitted from the oscillator 11 and the oscillation output signal output from the frequency divider 1214. The result of phase comparison is transmitted to the VCO 1212 via the loop filter. The VCO 1212 oscillates at a frequency corresponding to the result of phase comparison. In addition, the PLL circuit 121 has the PLL normal-oscillation mode and the PLL self-oscillation mode. In the PLL normal-oscillation mode, the oscillation frequency of the VCO 1212 varies depending on the result of phase comparison by the phase comparator. In the PLL self-oscillation mode, the oscillation frequency of the VCO 1212 is fixed to a predetermined frequency and the oscillation frequency of the VCO 1212 does not vary depending on the result of phase comparison by the phase comparator. A PLL self-oscillation control signal controls the operation mode of the PLL circuit 121. The frequency divider 122 divides the frequency of the clock signal output from the PLL circuit 121. The clock signal whose frequency has been divided by the frequency divider 122 is supplied to the ROM 123, the RAM 124, the A/D control unit 125, the CPU 126, the BSC 127, and the timer 128 as their operation clocks. The ROM 123 stores programs to be executed by the CPU 126. The CPU 126 executes programs in the ROM 123. The RAM 124 is used as a work area when the CPU 126 executes a program. The A/D control unit 125 controls the A/D conversion operation of the A/D conversion unit 14. The BSC 127 performs operations, such as dividing the physical address space and outputting control signals according to the bus state interface specification. The timer 128 is used for time measurement.

The voltage holding region 13 is a region in which supply of the second power source voltage VDD2 is held also in the low power consumption mode of the microcomputer 1. The voltage holding region 13 has a low power consumption mode control unit 131 and a self-oscillation flag setting register 132. The low power consumption mode control unit 131 includes an oscillation stabilizing time wait counter 1311 for counting the oscillation stabilizing time and performs control regarding the low power consumption mode of the oscillator 11, the PLL circuit 121, and the A/D control unit 125. The low power consumption mode control unit 131 shuts down supply of the first power source voltage VDD1 to the power-down region 12 by a power supply control signal, and resumes supply of the first power source voltage VDD1 to the power-down region 12 according to a return factor from the power-down state due to an interrupt. Furthermore, the low power consumption mode control unit 131 controls the operation of the oscillator 11 by an oscillation stop signal, controls the mode of the PLL circuit 121 by the PLL self-oscillation control signal, and controls the operation of the A/D control unit 125 by a STBY control signal.

When supply of the first power source voltage VDD1 to the power-down region 12 is resumed according to the return factor from the power-down state due to an interrupt, the PLL circuit 121 can return to the operation mode at the time of power-down by the low power consumption mode. The PLL circuit 121 is caused to return with the PLL normal-oscillation mode when it has transited to the low power consumption mode with the PLL normal-oscillation mode, and caused to return with the PLL self-oscillation mode when it has transited to the low power consumption mode with the PLL self-oscillation-mode. Such a control is performed by the low power consumption mode control unit 131 based on a flag state of the self-oscillation flag setting register 132. The CPU 126 sets a self-oscillation flag in the self-oscillation flag setting register 132. For example, the self-oscillation flag is set to logical "0" if the PLL circuit 121 is in the PLL normal-oscillation mode, and the self-oscillation flag is set to logical "1" if the PLL circuit 121 is in the PLL self-oscillation mode. When the PLL circuit 121 returns from the low power consumption mode, the low power consumption mode control unit 131 causes the PLL circuit 121 to return with the PLL normal-oscillation mode if the self-oscillation flag is logical "0", and causes the PLL circuit 121 to return with the PLL self-oscillation mode if the self-oscillation flag is logical "1".

FIG. 6 illustrates the states of respective parts in the PLL normal-oscillation mode and the PLL self-oscillation mode.

As shown in (A) of FIG. 6, the oscillator 11 includes a resistor 111 and a NOR gate 112, so that an oscillation stop signal is input to one of the input terminals of the NOR gate 112. In the PLL normal-oscillation mode, the low power consumption mode control unit 131 sets the oscillation stop signal and the PLL self-oscillation control signal to logical "0". When the oscillation stop signal is set to logical "0", an oscillation of the oscillator 11 generates the clock signal CLK having a predetermined frequency. The PLL circuit 121 generates a clock signal φ having a predetermined frequency, by multiplying the clock signal CLK transmitted from the oscillator 11 with the PLL self-oscillation control signal having been set to logical "0". By dividing the frequency of the output (φ) of the PLL circuit 121, the frequency divider 122 outputs a plurality of clock signals φ, φ/2, and φ/4 whose dividing ratios differ from each other.

In the PLL self-oscillation mode, the low power consumption mode control unit 131 sets the oscillation stop signal and the PLL self-oscillation control signal to logical "1". If the oscillation stop signal is set to logical "1", the oscillator 11 is stopped and the clock signal CLK is not generated. Additionally, if the PLL self-oscillation control signal is set to logical "1", the PLL circuit 121 is in the PLL self-oscillation mode and generates a clock signal φ' having a predetermined frequency (PLL self-oscillation frequency), regardless of the clock signal CLK from the oscillator 11. Although not particularly limited, the clock signal φ' has a frequency lower than the clock signal φ. By dividing the frequency of the output (φ') of the PLL circuit 121, the frequency divider 122 outputs a plurality of clock signal φ', φ'/2, and φ'/4 whose dividing ratios differ from each other.

Figure 3:
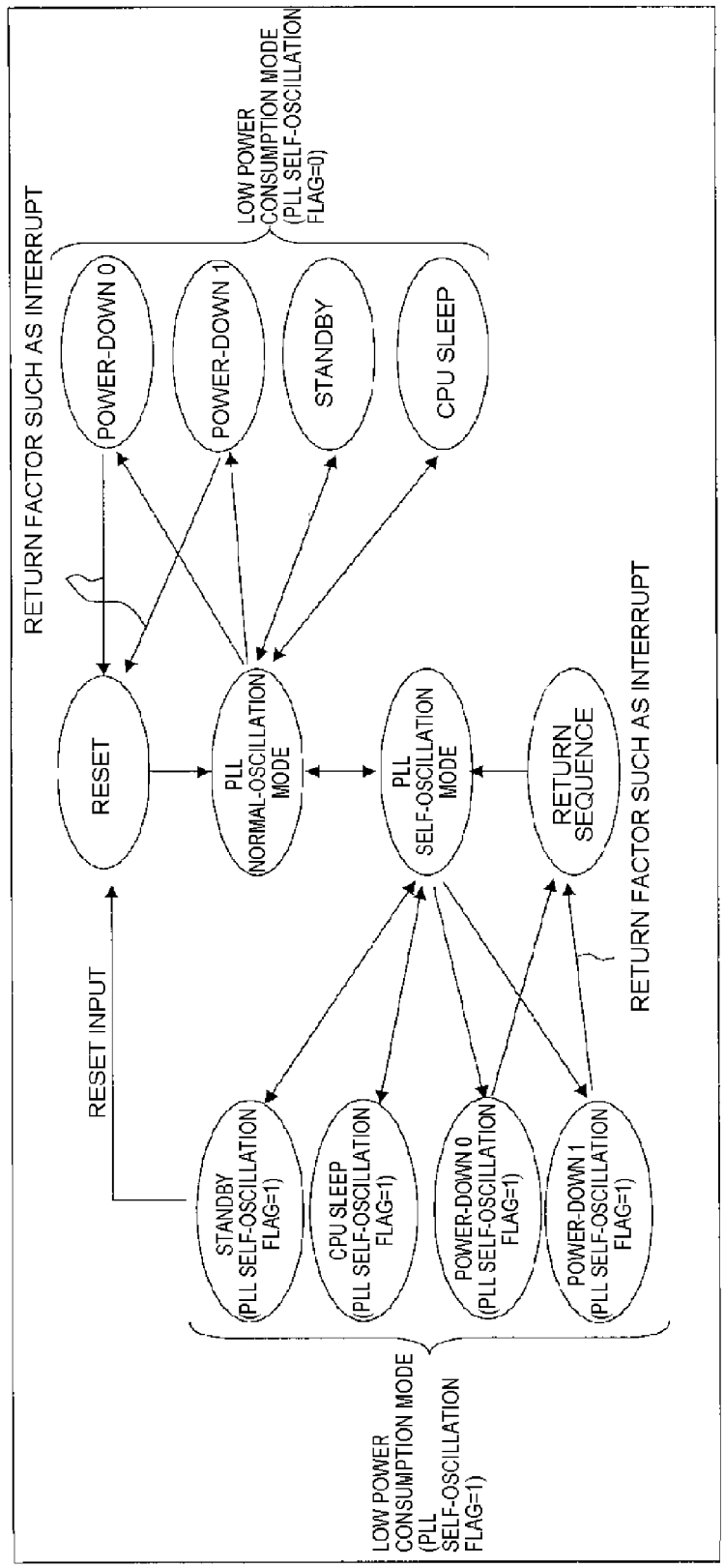
FIG. 3 is an explanatory diagram of a state transition of the microcomputer shown in FIG. 1.

FIG. 3 illustrates state transition of the microcomputer 1.

The microcomputer 1 includes power-down 0, power-down 1, standby, and CPU sleep as the low power consumption mode. Power-down 0 is a mode in which supply of the first power source voltage VDD1 to the power-down region 12 is shut down and the function of the timer 128 is enabled. Power-down 1 is a mode in which supply of the first power source voltage VDD1 to the power-down region 12 is shut down and the function of the timer 128 is disabled. Standby is a mode in which supply of the first power source voltage VDD1 to the power-down region 12 is not shut down and the operation of the PLL circuit 121 is stopped. CPU sleep is a mode in which supply of the first power source voltage VDD1 to the power-down region 12 is not shut down and the CPU 126 is in the sleep state. Although not shown in the figures, transition to each low power consumption mode is performed by register setting to the low power consumption mode register and execution of a SLEEP command. State transition from each low power consumption mode to the PLL normal-oscillation mode or the PLL self-oscillation mode is performed by a return factor due to an interrupt.

The initial state for the PLL circuit 121 in starting power supply (power-on) is set to the PLL normal-oscillation mode. In addition, the PLL circuit 121 is set to the PLL normal-oscillation mode also when a reset signal is asserted via a reset terminal of the microcomputer 1. In the PLL normal-oscillation mode, the self-oscillation flag of the self-oscillation flag setting register 132 is set to logical "0". If a transition to the low power consumption mode has occurred by power-down 0, power-down 1, standby, or CPU sleep in the PLL normal-oscillation mode, the PLL self-oscillation flag remains to be logical "0". If the PLL self-oscillation flag is logical "0", returning from the low power consumption mode by power-down 0 or power-down 1 is set to the PLL normal-oscillation mode again by a resetting process. If the PLL self-oscillation flag is logical "0", return from standby and the CPU-sleep state is also the PLL normal-oscillation mode.

When reducing power consumption is further required, the state of the PLL circuit 121 can be switched to the PLL self-oscillation mode.

When the CPU 126 changes the self-oscillation flag of the self-oscillation flag setting register 132 to logical "1" to set the PLL self-oscillation mode, the low power consumption mode control unit 131 switches the PLL circuit 121 to the PLL self-oscillation mode. In the PLL self-oscillation mode, the frequency of the clock signal output from the PLL circuit 121 is fixed to a frequency lower than that in the PLL normal-oscillation mode, which is supplied to each part in the microcomputer 1 via the frequency divider 122. In the PLL self-oscillation mode, since the frequency of the clock signal output from the PLL circuit 121 is fixed to a frequency lower than that in the PLL normal-oscillation mode, power consumption is reduced in comparison with the PLL normal-oscillation mode. Additionally, if the self-oscillation flag of the self-oscillation flag setting register 132 is logical "1", returning from the low power consumption mode by power-down 0 or by power-down 1 is set to the PLL self-oscillation mode again by a predetermined return sequence. If the PLL self-oscillation flag is logical "1", returning from the standby and CPU sleep state is also in the PLL self-oscillation mode.

The PLL circuit 121 may be configured to be set to the PLL self-oscillation mode in the initial state in starting power supply (power-on).

FIG. 4 illustrates current waveforms in returning from the power-down state in the PLL normal-oscillation mode and the PLL self-oscillation mode. (A) of FIG. 4 is a current waveform in the PLL normal-oscillation mode, and (B) of FIG. 4 is a current waveform in the PLL self-oscillation mode.

In the PLL self-oscillation mode, since the oscillation frequency of the VCO 1212 is fixed to a predetermined frequency and the oscillation frequency of the VCO 1212 does not vary according to the result of phase comparison by the phase comparator 1211, the low power consumption mode control unit 131 can stop the operation of the oscillator 11. In the PLL self-oscillation mode, since stopping the operation of the oscillator 11 eliminates current consumption in the oscillator 11, the current consumption is reduced accordingly.

Additionally, since it is not necessary to wait for the oscillation state of the oscillator 11 to stabilize in the PLL self-oscillation mode, the oscillation stabilizing time in the PLL self-oscillation mode is significantly shortened compared with the oscillation stabilizing time in the PLL normal-oscillation mode. As a result, current which flows at start-up can be reduced by starting in the PLL self-oscillation mode.

FIG. 5 illustrates a switching sequence between the PLL normal-oscillation mode and the PLL self-oscillation mode.

The PLL normal-oscillation mode is switched to the PLL self-oscillation mode as shown in (A) of FIG. 5. When the CPU 126 executes a user program in the PLL normal-oscillation mode, the self-oscillation flag of the self-oscillation flag setting register 132 is set to logical "1". Then, a sleep (SLEEP) instruction is issued and executed by the CPU 126 to stop the operation of the CPU 126 (user program execution stopped). Since the self-oscillation flag of the self-oscillation flag setting register 132 is logical "1", the low power consumption mode control unit 131 asserts the oscillation stop signal to stop the operation of the oscillator 11, and switches the PLL circuit 121 from the PLL normal-oscillation mode to the PLL self-oscillation mode by asserting the PLL self-oscillation control signal to a high-level. Subsequently, after the PLL self-oscillation has stabilized, the CPU can execute the user program. The time required for the PLL self-oscillation to stabilize is the time until the oscillation stabilizing time wait counter 1311 counts the clock signal up to a predetermined number.

The PLL self-oscillation mode is switched to the PLL normal-oscillation mode as shown in (B) of FIG. 5. When the CPU 126 executes a user program in the PLL self-oscillation mode, the self-oscillation flag of the self-oscillation flag setting register 132 is set to logical "0". Then, a sleep (SLEEP) instruction is issued and executed by the CPU 126 to stop the operation of the CPU 126 (user program execution stopped). Since the self-oscillation flag of the self-oscillation flag setting register 132 is logical "0", the low power consumption mode control unit 131 negates the oscillation stop signal to operate the oscillator 11, and switches the PLL circuit 121 from the PLL self-oscillation mode to the PLL normal-oscillation mode by negating the PLL self-oscillation control signal to a low level. Subsequently, after the operation of the oscillator 11 and the operation of the PLL circuit 121 have stabilized, the CPU 126 can execute the user program. The time required for the operation of the oscillator 11 and the operation of the PLL circuit 121 to stabilize is the time until the oscillation stabilizing time wait counter 1311 counts the clock signal up to a predetermined number. Since it is necessary to consider the stabilizing time of the oscillator 11 in switching from the PLL self-oscillation mode to the PLL normal-oscillation mode, the time until the oscillation stabilizing time wait counter 1311 counts the clock signal up to the predetermined number becomes longer than in switching from the PLL normal-oscillation mode to the PLL self-oscillation mode.

According to the embodiment 1, the PLL circuit 1212 can start up from the PLL normal-oscillation state in the initial state at power-on and switching to the PLL self-oscillation mode is allowed if lower power consumption is still required. According to the microcomputer 1, the self-oscillation flag setting register 132 allows distinction between the PLL normal-oscillation mode and the PLL self-oscillation mode and control that ensures that the operation mode in returning from the low power consumption mode is the same as the operation mode immediately before transiting to the low power consumption mode.

<<Embodiment 2>>

Figure 7:
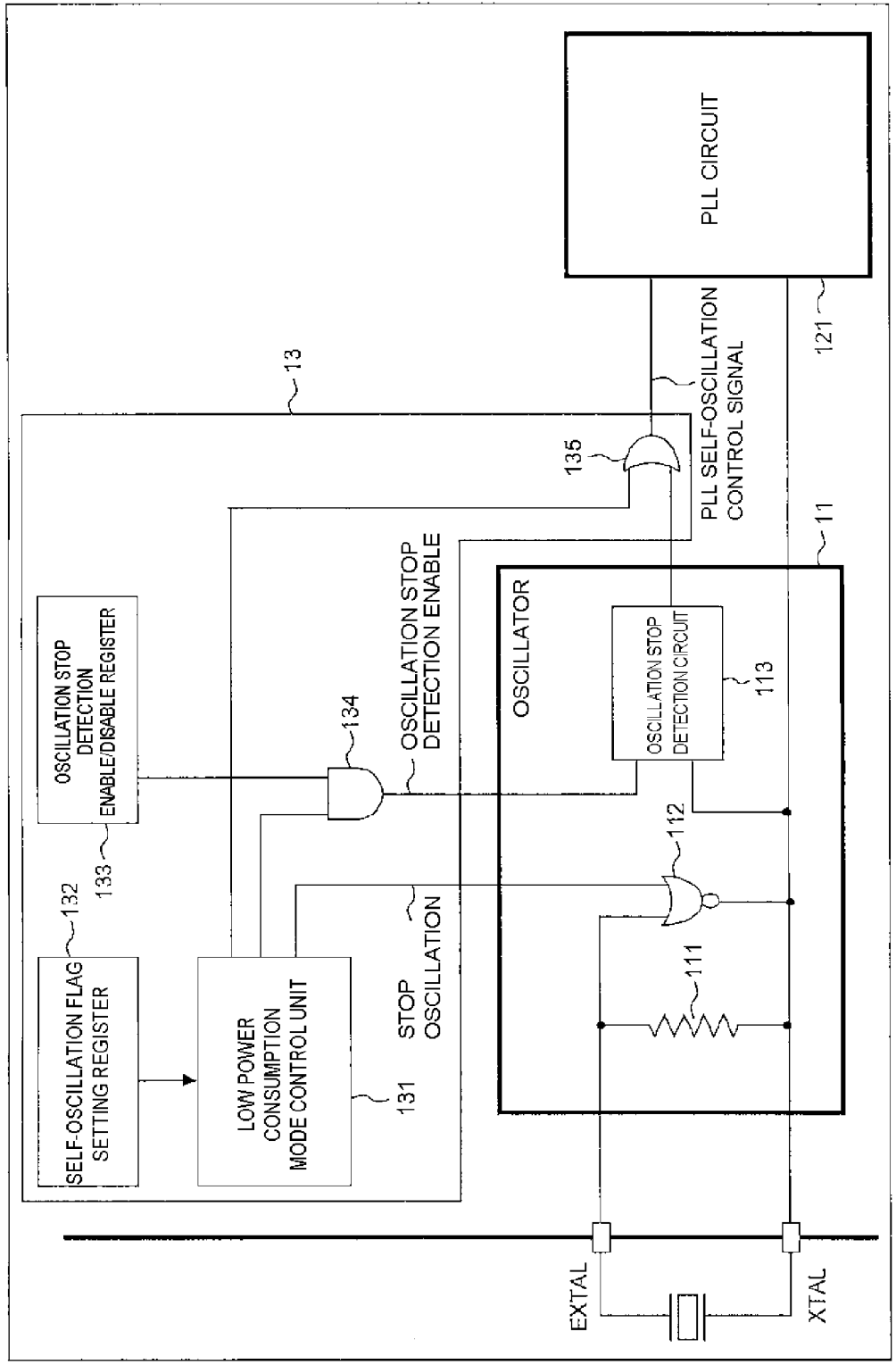
FIG. 7 is another exemplary block diagram of an oscillator and a voltage holding region in the microcomputer shown in FIG. 1.

FIG. 7 illustrates another configuration example of the oscillator 11 and the voltage holding region 13 shown in FIG. 1.

The oscillator 11 shown in FIG. 7 includes the oscillation stop detection circuit 113 which can detect stop of the oscillation in the oscillator circuit 11.

The voltage holding region 13 shown in FIG. 7 includes not only the low power consumption mode control unit 131 and the self-oscillation flag setting register 132 but an oscillation stop detection enable/disable register 133, an AND gate 134, and an OR gate 135. Whether to enable or disable the oscillation stop detection function of the oscillation stop detection circuit 113 can be set in the oscillation stop detection enable/disable register 133. The CPU can make the setting. The AND gate 134 acquires the AND logic of a signal indicating the PLL self-oscillation mode from the low power consumption mode control unit 131 and an output signal of the oscillation stop detection enable/disable register 133. According to the output signal (oscillation stop detection valid signal) of the AND gate 134, the oscillation stop detection function of the oscillation stop detection circuit 113 is enabled or disabled. The OR gate 135 acquires the OR logic of the result of oscillation stop detection by the oscillation stop detection circuit 113 and the PLL self-oscillation control signal from the low power consumption mode control unit 131. The output of the OR gate 135 is transmitted to the PLL circuit 121 as the PLL self-oscillation control signal. If the oscillator circuit 11 stops while the oscillation stop detection function of the oscillation stop detection circuit 113 is enabled, the oscillation stop detection circuit 113 detects the oscillation stop and the PLL circuit 121 transits to the PLL self-oscillation mode when the PLL self-oscillation control signal is asserted.

To stop the oscillator 11 in the above configuration, the PLL self-oscillation control signal switches the operation mode of the PLL circuit 121 to the PLL self-oscillation mode, the oscillation stop detection function of the oscillation stop detection circuit 113 is disabled for the oscillation stop detection enable/disable register 133, and then the low power consumption mode control unit 131 stops the oscillator 11 by asserting the oscillation stop signal. Additionally, to prevent malfunction of the oscillation stop detection circuit 113 in resuming the operation of the oscillator 11, the oscillation stop detection enable/disable register 133 is set so that the oscillation stop detection function of the oscillation stop detection circuit 113 is enabled after the oscillation of the oscillator 11 has stabilized.

<<Embodiment 3>>

Figure 8:
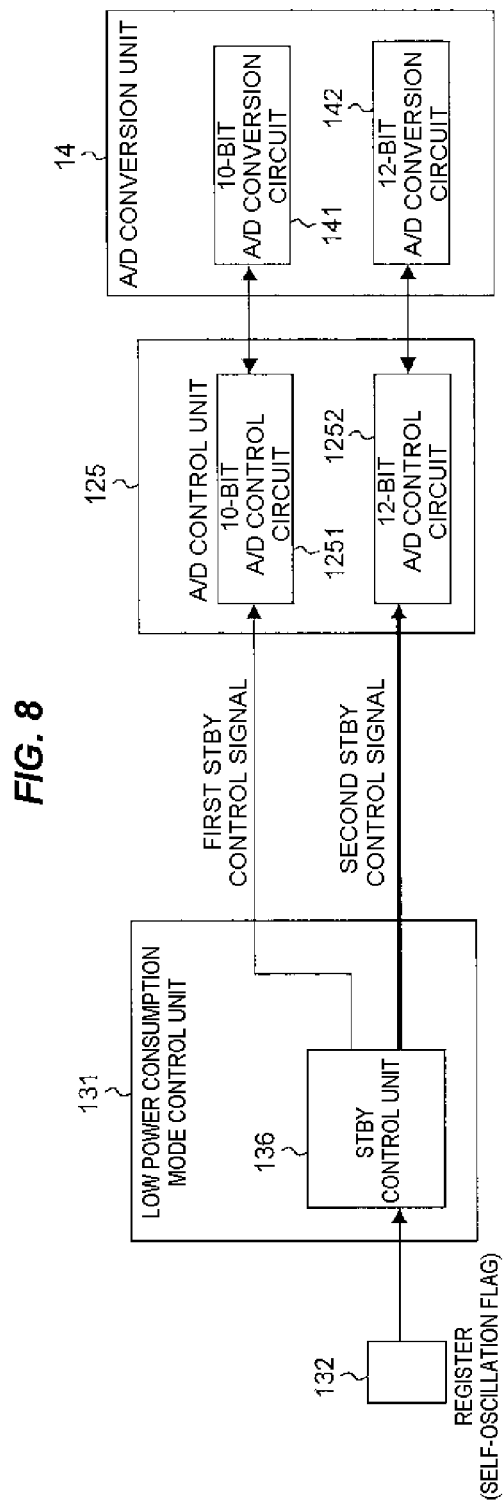
FIG. 8 is another exemplary block diagram of a low power consumption mode control unit, an A/D control unit, and an A/D conversion unit in FIG. 1.

FIG. 8 illustrates another configuration example of the low power consumption mode control unit 131, the A/D control unit 125, and the A/D conversion unit 14 of FIG. 1.

The A/D conversion unit 14 may have two A/D conversion units having different conversion accuracies. In the exemplary configuration shown in FIG. 8, the A/D conversion unit 14 has a 10-bit A/D conversion circuit 141 with an accuracy of 10 bits and a 12-bit A/D conversion circuit 142 with an accuracy of 12 bits.

The A/D control unit 125 may have a 10-bit A/D control circuit 1251 and a 12-bit A/D control circuit 1252, corresponding to the configuration of the A/D conversion unit 14. The 10-bit A/D control circuit 1251 controls the operation of 10-bit A/D conversion circuit 141 based on a first STBY control signal. The 12-bit A/D control circuit 1252 controls the operation of 12-bit A/D conversion circuit 142 based on a second STBY control signal.

The low power consumption mode control part 131 may have an STBY control unit 136 which generates the first STBY control signal and the second STBY control signal based on the flag state of the self-oscillation flag setting register 132.

The 10-bit A/D conversion circuit 141 and the 12-bit A/D conversion circuit 142 differ in time until their operation stabilizes after they return from the standby state (referred to as "stabilizing time"). Typically, the higher the conversion accuracy is, the more complicated the circuit becomes and the longer the stabilizing time is. Therefore, the stabilizing time of the 12-bit A/D conversion circuit 142 becomes longer than that of the 10-bit A/D conversion circuit 141. To reduce the consumption current in the PLL self-oscillation mode, it is better to return only one, than both, of the 10-bit A/D conversion circuit 141 and the 12-bit A/D conversion circuit 142 from the standby state, in the PLL self-oscillation mode. Since a longer stabilizing time increases consumption current, returning the 10-bit A/D conversion circuit 141 having a shorter stabilizing time from the standby state is more advantageous than returning the 12-bit A/D conversion circuit 142 having a longer stabilizing time from the standby state, to further reduce the consumption current in the PLL self-oscillation mode. In the example, consumption current in the PLL self-oscillation mode is reduced by returning both the 10-bit A/D conversion circuit 141 and the 12-bit A/D conversion circuit 142 from the standby state in the PLL normal-oscillation mode, and returning only the 10-bit A/D conversion circuit 141 having a shorter stabilizing time from the standby state in the PLL self-oscillation mode.

FIG. 9 illustrates a control timing of the A/D conversion unit 14.

When returning from the low power consumption mode with the PLL normal-oscillation mode, both the 10-bit A/D conversion circuit 141 and the 12-bit A/D conversion circuit 142 return from the standby (STBY) state, as shown in (A) of FIG. 9. Since the stabilizing time of the 12-bit A/D conversion circuit 142 becomes longer than that of the 10-bit A/D conversion circuit 141, resetting the CPU 126 is canceled, considering the stabilizing time of the 12-bit A/D conversion circuit 142.

In returning from the low power consumption mode with the PLL self-oscillation mode, only the 10-bit A/D conversion circuit 141 having a shorter stabilizing time returns from the standby state, and the 12-bit A/D conversion circuit 142 is kept in the stand-by state, as shown in (B) of FIG. 9. Since it is not necessary to consider the stabilizing time of the 12-bit A/D conversion circuit 142, the timing to cancel resetting the CPU 126 can be set earlier in comparison with in returning from the low power consumption mode with the PLL normal-oscillation mode.

The 10-bit A/D conversion circuit 141 and the 12-bit A/D conversion circuit 142 are examples of analog modules. In mounting an analog module which is different from the 10-bit A/D conversion circuit 141 and the 12-bit A/D conversion circuit 142, the STBY control unit 136 can generate the STBY control signal to limit returning of the analog module from the standby state in the PLL self-oscillation mode, considering the characteristic of the analog module.

The A/D conversion unit 14 may have three or more A/D conversion circuits, and the A/D control unit 125 may have a plurality of A/D control circuits corresponding to the A/D conversion circuits within the A/D conversion unit 14.

<<Embodiment 4>>

Figure 10:
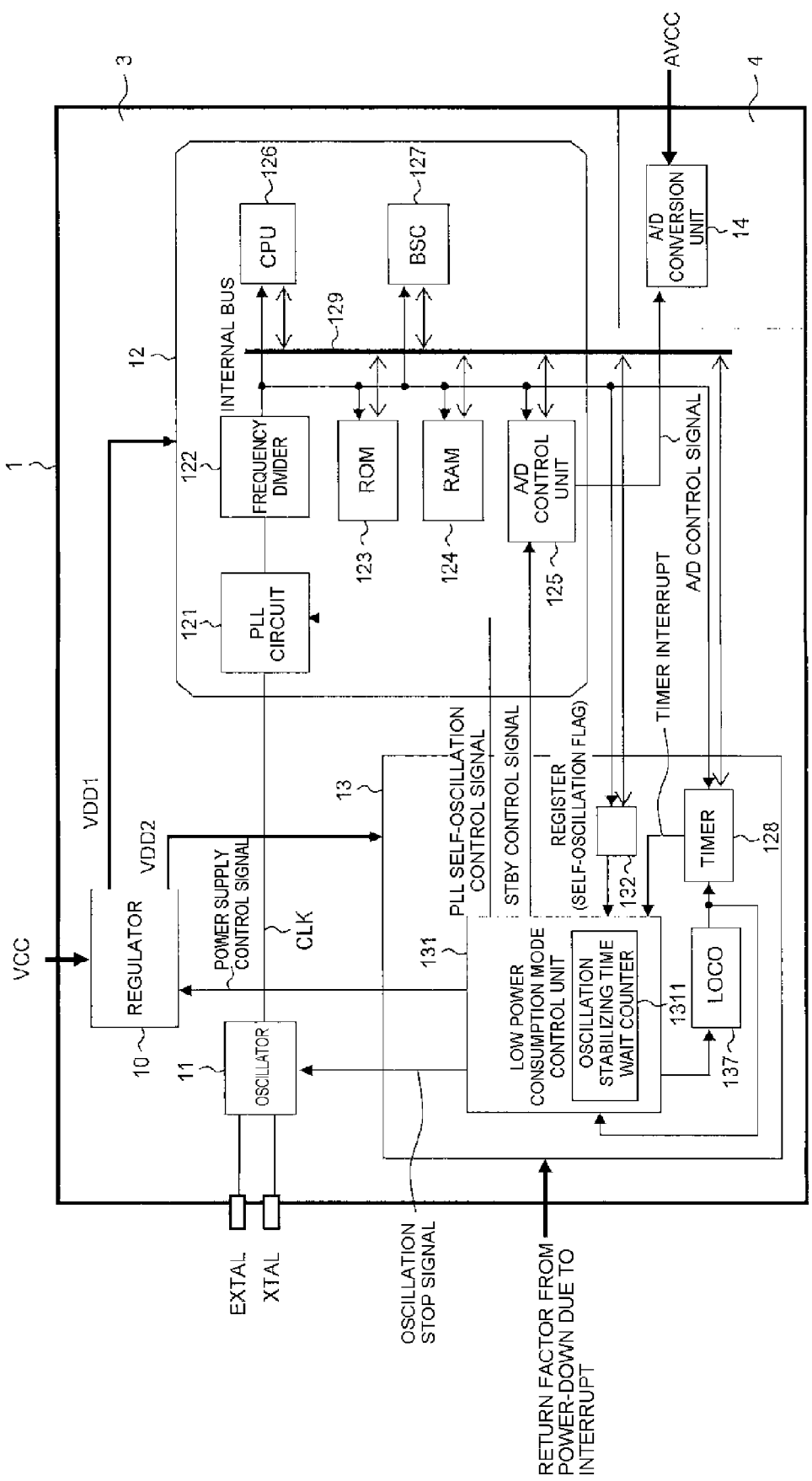
FIG. 10 is another exemplary block diagram of the main part in the microcomputer shown in FIG. 1.

FIG. 10 illustrates a configuration example of the microcomputer 1 described above.

Figure 11:
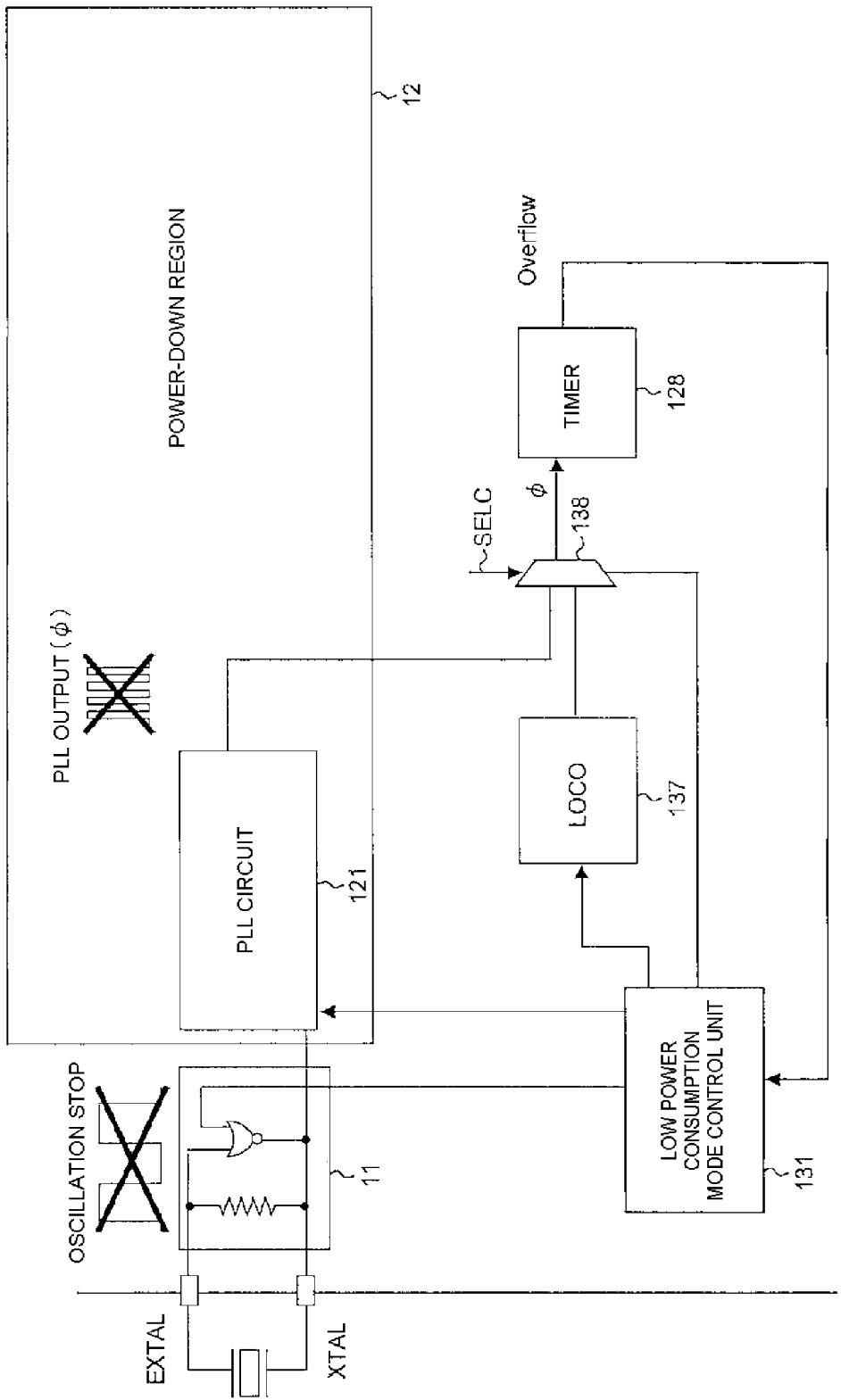
FIG. 11 is another exemplary block diagram of the main part in the microcomputer shown in FIG. 1.

The microcomputer 1 in FIG. 10 largely differs from that shown in FIG. 1 in that the timer 128 of the power-down region 12 is moved to the voltage holding region 13, and the voltage holding region 13 has a low frequency oscillator (LOCO) 137. Since the voltage holding region 13 has the timer 128, the timer 128 can continue operating after power-down of the power-down region 12. The low frequency oscillator 137 generates a clock signal by an oscillation which is different from that of the oscillator 11. The low frequency oscillator 137 is activated in the low power consumption mode by the control of the low power consumption mode control unit 131 to generate a clock signal. The frequency of the clock signal generated in the low frequency oscillator 137 is set to 125 kHz, although not particularly limited. The clock signal generated in the low frequency oscillator 137 is transmitted to the timer 128 and the oscillation stabilizing time wait counter 1311. The timer 128 and the oscillation stabilizing time wait counter 1311 count the clock signals generated in the low frequency oscillator 137. To control a device which needs to be processed at an accurate timing, a timer interrupt can be performed by using the timer 128. To intermittently operate the microcomputer 1 at a predetermined time interval, the timer interrupt is used. As shown in FIG. 11, a selector 138 may be provided between the low frequency oscillator 137 and the timer 128 so that the output of the PLL circuit 121 and the output of the low frequency oscillator 137 are selectively transmitted to the timer 128. The output of the PLL circuit 121 is transmitted to the timer 128 via the selector 138 during the normal operation before transition to the low power consumption mode. In the low power consumption mode, the output of the low frequency oscillator 137 is transmitted to the timer 128 via the selector 138. The selection operation of the selector 138 is controlled by a selector control signal SELC generated by the low power consumption mode control unit 131. An overflow signal (Overflow) indicating that the count state of the timer 128 has exceeded a maximum value is transmitted from the timer 128 to the low power consumption mode control unit 131. When power-down 0 (a mode in which the function of the timer 128 is enabled and the power supply to the power-down region 12 is shut down) is enabled, the low power consumption mode control unit 131 operates the low frequency oscillator 137 so that the clock signal is supplied to the timer 128 because the timer 128 needs to operate after power-down of the power-down region 12. The microcomputer 1 may be configured so that asserting an overflow signal causes return from the low power consumption mode by the control of the low power consumption mode control unit 131.

<<Embodiment 5>>

Figure 12:
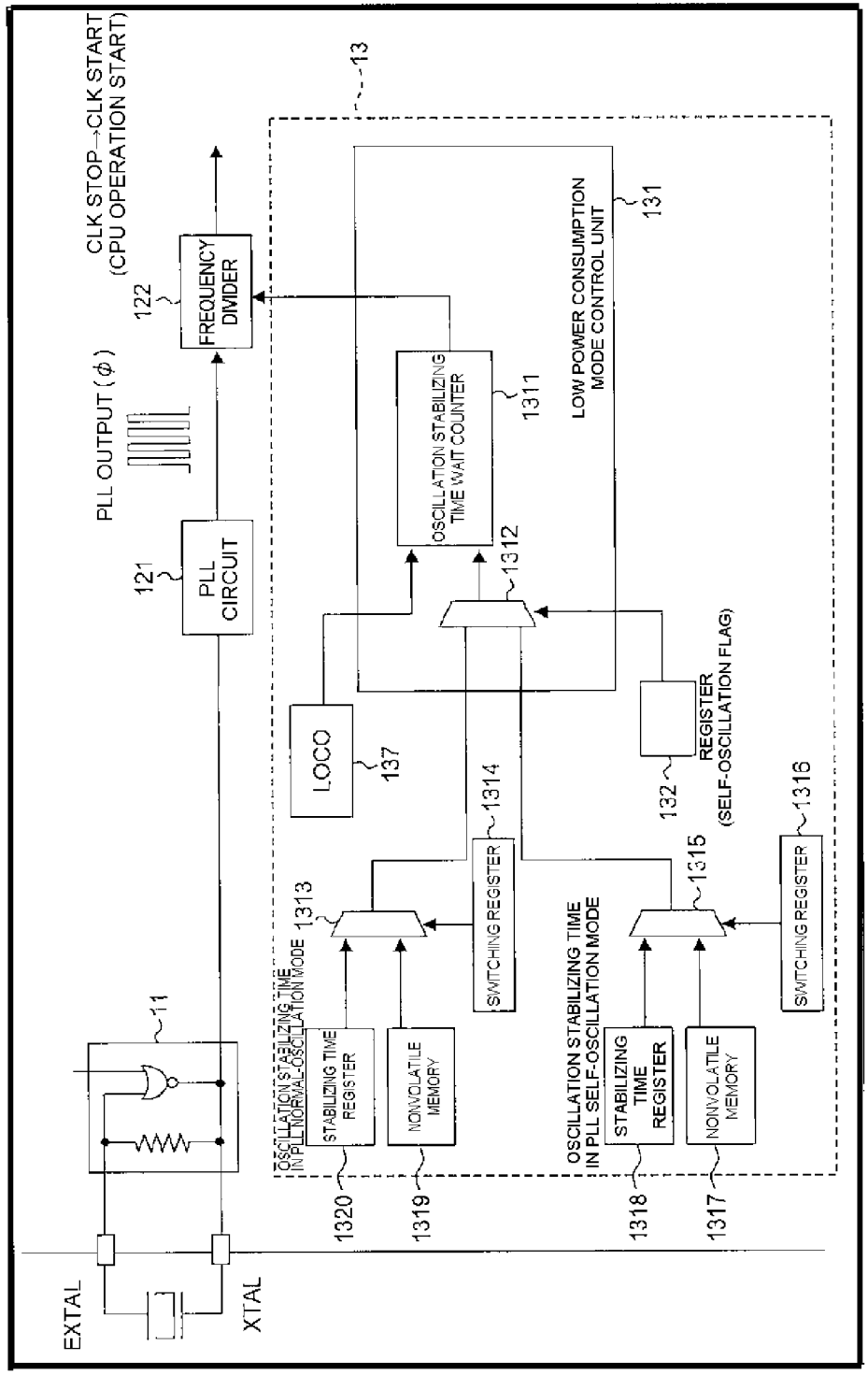
FIG. 12 is another exemplary block diagram of the main part in the microcomputer shown in FIG. 1.

In FIG. 1, it is necessary to start the operation of the CPU 126 or the like after the operation of the oscillator and the PLL circuit 121 has stabilized. Then, the stabilizing time is kept by the oscillation stabilizing time wait counter 1311. The clock signals output from the low frequency oscillator 137 are counted by the oscillation stabilizing time wait counter 1311, and outputting clock signals from the frequency divider 122 is started when the count value reaches a reference value. If possible, it is convenient to change the oscillation stabilizing time according to various conditions. To realize this, the voltage holding region 13 may be configured as shown in FIG. 12.

The low power consumption mode control unit 131 has a selector 1312 so that the selector 1312 can selectively transmit the output of a selector 1313 and that of a selector 1315 to the oscillation stabilizing time wait counter 1311. Selection operation of the selector 1312 is controlled according to the self-oscillation flag of the self-oscillation flag setting register 132. The output of the selector 1313 is selected when the self-oscillation flag is logical "0", and that of the selector 1315 is selected when the self-oscillation flag is logical "1".

The selector 1313 selectively transmits the output of the stabilizing time register 1320 and that of the nonvolatile storage unit 1319 to the selector 1312 according to the setting information of a switching register 1314. The CPU 126 can set oscillation stabilizing time information in the PLL normal-oscillation mode in the stabilizing time register 1320. A reference value of the oscillation stabilizing time information in the PLL normal-oscillation mode is written to the nonvolatile storage unit 1319. The CPU 126 can set the switching register 1314. If the oscillation stabilizing time information in the PLL normal-oscillation mode is the reference value in the nonvolatile storage unit 1319, the selector 1313 selectively transmits the reference value in the nonvolatile storage unit 1319 to the selector 1312. Changing the oscillation stabilizing time information in the PLL normal-oscillation mode needs to write a value after changing the oscillation stabilizing time information in the PLL normal-oscillation mode, in initializing the system for example, to the stabilizing time register 1320. The setting of the switching register 1314 is changed so that the selector 1313 selects the output of the stabilizing time register 1320. Accordingly, the output of the stabilizing time register 1320 is selected in the PLL normal-oscillation mode. Based on this, the oscillation stabilizing time in the PLL normal-oscillation mode is determined.

The selector 1315 selectively transmits the output of a stabilizing time register 1318 and that of a nonvolatile storage unit 1317 to the selector 1312 according to setting information of a switching register 1316. The CPU 126 can set oscillation stabilizing time information in the PLL self-oscillation mode in the stabilizing time register 1318. A reference value of the oscillation stabilizing time information in the PLL self-oscillation mode is written to the nonvolatile storage unit 1317. The CPU 126 can set the switching register 1316. If the oscillation stabilizing time information in the PLL self-oscillation mode is allowed to be the reference value in the nonvolatile storage unit 1317, the selector 1315 selectively transmits the reference value in the nonvolatile storage unit 1317 to the selector 1312. Changing the oscillation stabilizing time information in the PLL self-oscillation needs to write a value after changing the oscillation stabilizing time information in the PLL self-oscillation mode, in initializing the system for example, into the stabilizing time register 1318. The setting of the switching register 1316 is changed so that the selector 1315 selects the output of the stabilizing time register 1318. Accordingly, the output of the stabilizing time register 1318 is selected in the PLL self-oscillation mode. Based on this, the oscillation stabilizing time in the PLL self-oscillation mode is determined.

<<Embodiment 6>>

Whether or not the operation of the oscillator 11 and the PLL circuit 121 has stabilized may be determined as follows.

Figure 13A:
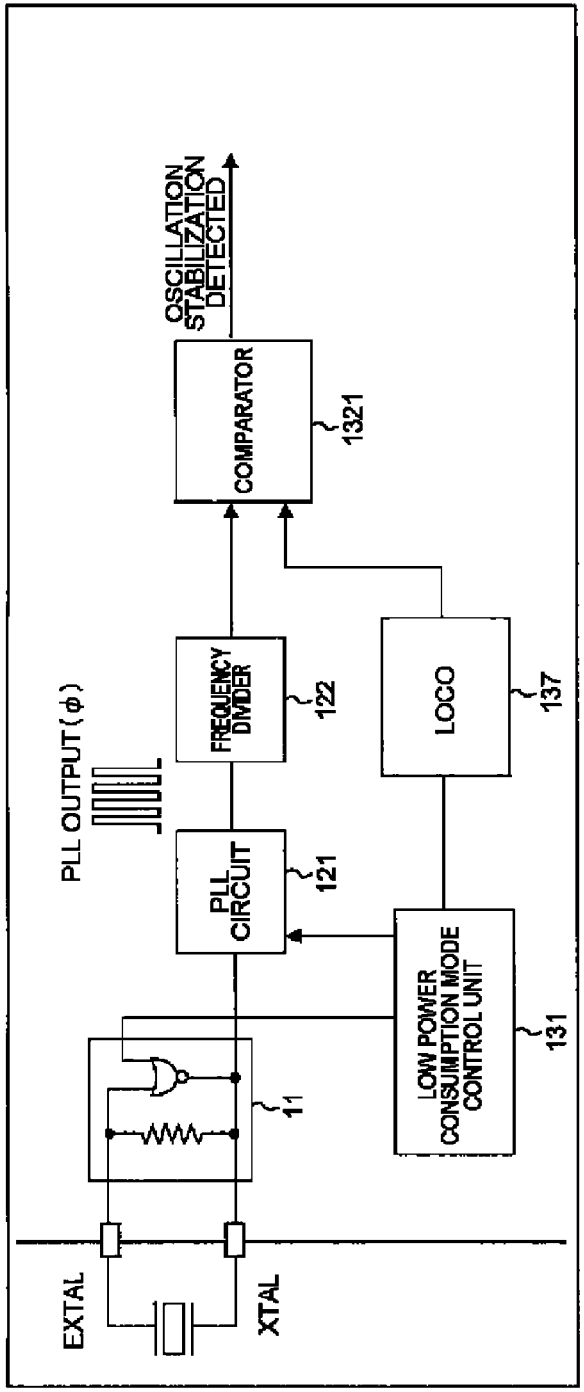
FIG. 13 is another explanatory diagram of the main part in the microcomputer shown in FIG. 1.
Figure 13B:
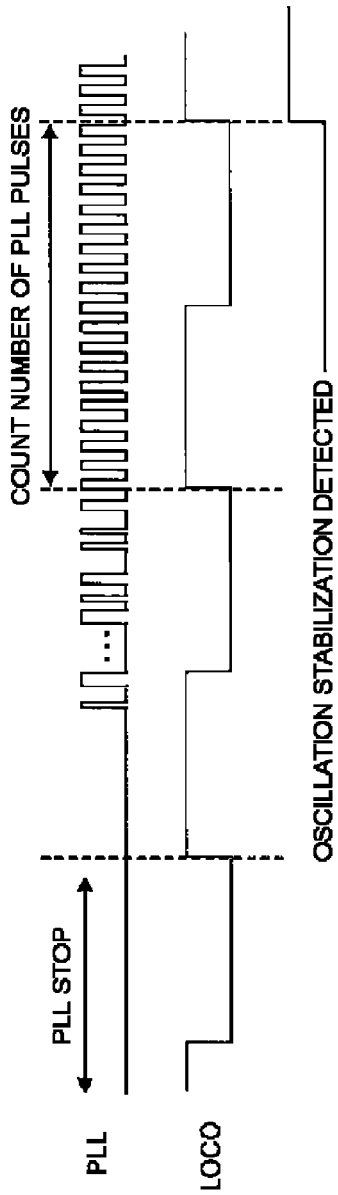

As shown in (A) of FIG. 13, a comparator 1321 is provided to determine whether the frequency of the clock signal output from the frequency divider 122 has reached that of the clock signal output from the low frequency oscillator 137. The low frequency oscillator 137 operates in the low power consumption mode, and the PLL circuit 121 starts its operation when the low frequency oscillator 137 returns from the low power consumption mode. With the frequency of the clock signal output from the low frequency oscillator 137 in the low power consumption mode defined as a standard frequency, the comparator 1321 determines whether the frequency of the clock signal output from the frequency divider 122 has reached the standard frequency. Then, as shown in (B) of FIG. 13, the comparator 1321 asserts the oscillation stabilization detection signal at a high level when the frequency of the clock signal output from the frequency divider 122 has reached the standard frequency. The oscillation stabilization detection signal allows to recognize that the operation of the oscillator 11 and the PLL circuit 121 has stabilized.

<<Embodiment 7>>

Figure 14:
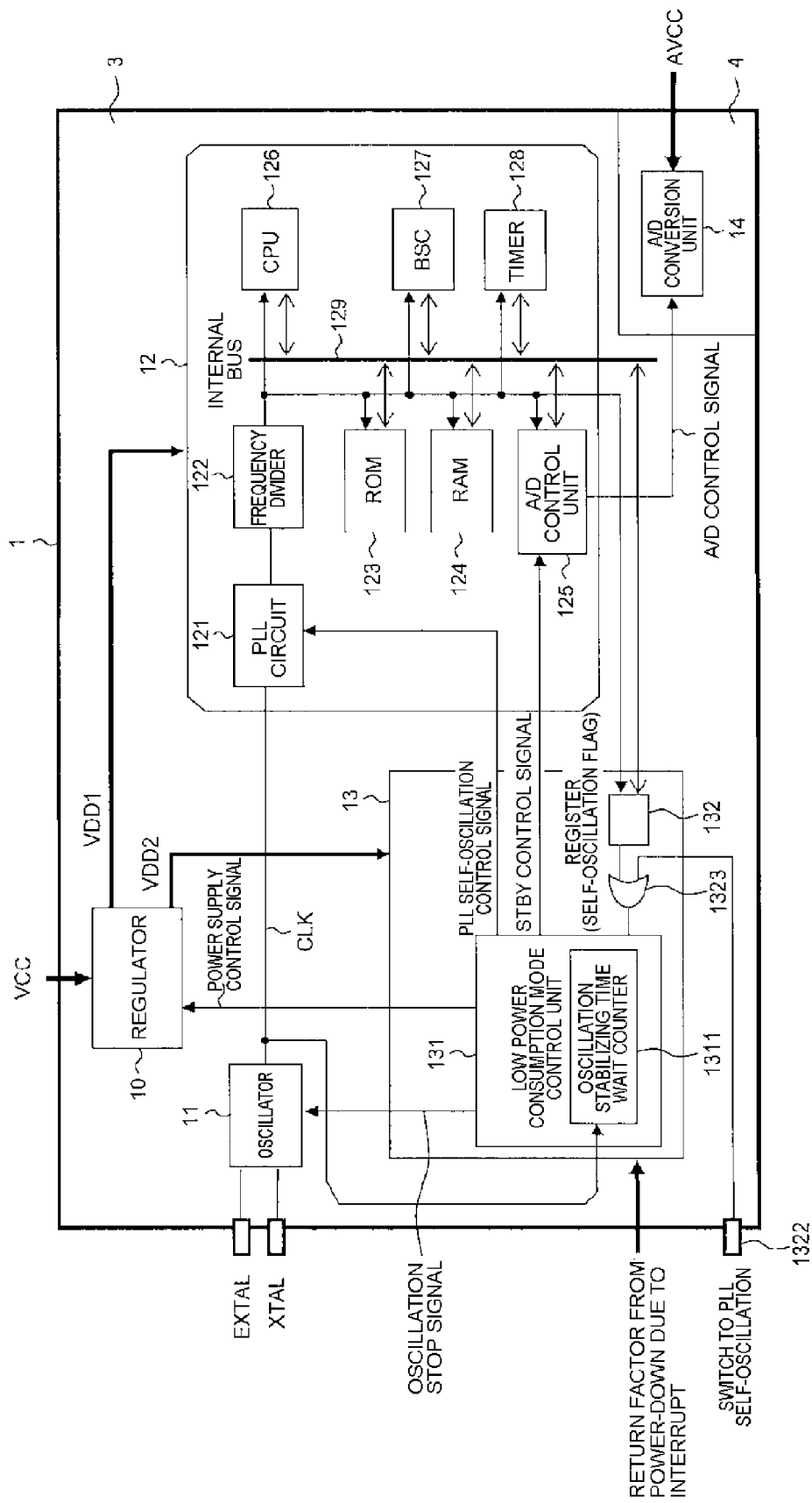
FIG. 14 is another exemplary block diagram of the main part in the microcomputer shown in FIG. 1.

FIG. 14 illustrates another configuration example of the microcomputer 1.

The microcomputer 1 in FIG. 14 largely differs from that shown in FIG. 1 in that the voltage holding region 13 has an OR gate 1323, the OR gate 1323 acquires the OR logic between the output of the self-oscillation flag setting register 132 and the logic state of an external terminal 1322, and the OR logic is input to the low power consumption mode control unit 131. In the configuration in FIG. 1, the low power Consumption mode control unit 131 returns the PLL circuit 121 from the lower power consumption mode in the PLL normal-oscillation mode if the self-oscillation flag in the self-oscillation flag setting register 132 is logical "0" in returning from the mode, and returns the PLL circuit 121 from the lower power consumption mode in the PLL self-oscillation mode if the self-oscillation flag in the self-oscillation flag setting register 132 is logical "1". In the configuration in FIG. 14, the PLL circuit 121 can return from the low power consumption mode in the PLL self-oscillation mode regardless of the logic state of the self-oscillation flag in the self-oscillation flag setting register 132, when the PLL self-oscillation switching signal, which is input to the external terminal 1322, is set to logical "1".

<<Embodiment 8>>

The microcomputer 1 can apply to various systems.

Figure 15:
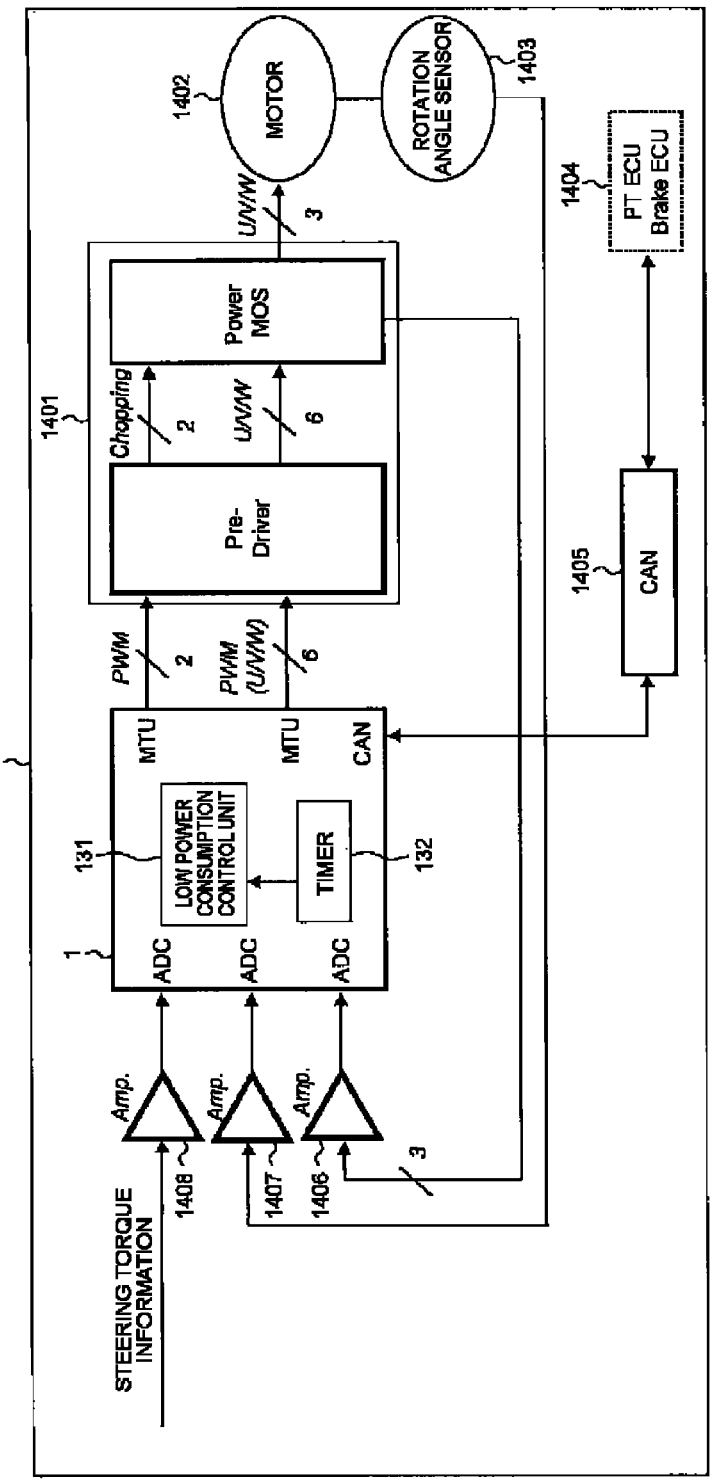
FIG. 15 is an exemplary block diagram of an application of the microcomputer provided as an example of the semiconductor device according to the present invention.

FIG. 15 shows an automobile control system 2 to which the microcomputer 1 applies.

The automobile control system 2 includes a function of assisting the driver's steering. This function allows the driver to steer the wheel without much strength.

The automobile control system 2 has a motor 1402 to assist the driver's steering. Steering torque information is detected by a sensor and input to the microcomputer 1 via an amplifier 1408. A motor control unit 1401 controls the motor 1402. A rotation angle sensor 1403 detects the rotation angle of the motor 1402. The result of detection by the rotation angle sensor 1403 is input to the microcomputer 1 via an amplifier 1407. The motor control unit 1401 includes a power MOS transistor circuit for driving the motor 1402 by three-phase power U/V/W, and a pre-driver circuit for driving it. Angle information of the three-phase power U/V/W is input from the power MOS transistor circuit to the microcomputer 1 via an amplifier 1406. The microcomputer 1 controls the motor 1402 using a pulse width modulation signal (PWM), based on the information input via the amplifiers 1406, 1407, and 1408. In addition, the microcomputer 1 is coupled to a communication module (CAN) 1405. The communication module (CAN) 1405 is coupled to an electronic control unit for a drive system of an engine or the like (PTECU), and an electronic control unit for brake control (BrakeECU) 1404.

The automobile control system 2 returns from the low power consumption mode at a predetermined time interval by the timer 128 in the microcomputer 1 while the engine is stopped such as idling stop, checks the information from various sensors, determines whether or not to control the motor 1402, and performs a predetermined control as necessary. Subsequently, the microcomputer 1 transits to the low power consumption mode again. The power consumption in the microcomputer 1 reduces when the PLL circuit 121 is set to the PLL self-oscillation mode and moreover the oscillator 11 stops.

Although the invention made by the inventors has been specifically described above based on embodiments, the invention is not limited and can be modified in various ways without deviating from the scope. In addition, each of the embodiments can be freely combined.

What is claimed is:

1. A semiconductor device comprising:
a first region which receives power from a first power supply source line only during a power-supply state and which is configured to return to the power-supply state after having transited from the power-supply state to a power-down state;
a second region which receives power from a second power supply source line during both the power-supply state and the power-down state of the first region; and
an oscillator which generates a first clock signal supplied to the first region,
wherein the first region includes a PLL circuit having a PLL normal-oscillation mode for generating a second clock signal which synchronizes with the first clock signal generated in the oscillator, and a PLL self-oscillation mode for generating a third clock signal which is asynchronous with the first clock signal, and the second region includes an information holding unit configured to store information which can distinguish whether the operation mode of the PLL circuit when the first region transits from the power-supply state to the power-down state is the PLL normal-oscillation mode or the PLL self-oscillation mode,
wherein the second region includes a control unit which determines, according to the information held in the information holding unit, the operation mode of the PLL circuit when the first region has returned from the power-down state to the power-supply state,
wherein the control unit determines the operation mode of the PLL circuit so that the operation mode of the PLL circuit when the first region transits from the power-supply state to the power-down state is the same as that of the PLL circuit when the first region returns from the power-down state to the power-supply state,
wherein the control unit stops the oscillator when the PLL circuit is regarded to be in the PLL self-oscillation mode,
wherein the oscillator include as oscillation stop detection circuit which can detect the stop of oscillation, and
wherein the second region includes a register in which whether of not to enable an oscillation stop detection function by the oscillation stop detection circuit can be set, and a logic gate for disabling, regardless of the setting in the register, the oscillation stop detection function by the oscillation stop detection circuit when the PLL circuit is regards to be in the PLL self-oscillation mode by the control unit.

2. A semiconductor device comprising:
a first region which receives power from a first power supply source line only during a power-supply state and which is configured to return to the power-supply state after having transited from the power-supply state to a power-down state;
a second region which receives power from a second power supply source line during both the power-supply state and the power-down state of the first region; and
an oscillator which generates a first clock signal supplied to the first region,
wherein the first region includes a PLL circuit having a PLL normal-oscillation mode for generating a second clock signal which synchronizes with the first clock signal generated in the oscillator, and a PLL self-oscillation mode for generating a third clock signal which is asynchronous with the first clock signal, and the second region includes an information holding unit configured to store information which can distinguish whether the operation mode of the PLL circuit when the first region transits for the power-supply state to the power-down state is the PLL normal-oscillation mode or the PLL self-oscillation mode,
wherein the second region includes a control unit which determines, according to the information held in the information holding unit, the operation mode of the PLL circuit when the first region has returned from the power-down state to the power-supply state,
wherein the control unit determines the operation mode of the PLL circuit so that the operation mode of the PLL circuit when the first region transits from the power-supply state to the power-down state is the same as that of the PLL circuit when the first region returns from the power-down state to the power-supply state,
wherein the control unit stops the oscillator when the PLL circuit is regarded to be in the PLL self-oscillation mode,
wherein the oscillator include as oscillation stop detection circuit which can detect the stop of oscillation, and
wherein the second region includes a standby control unit which limits returning of an analog module from a stand-by state in returning in the PLL self-oscillation mode, according to the information held in the information holding unit.

3. The semiconductor device according to claim 2,
wherein the semiconductor device includes a first A/D conversion circuit that converts an analog signal into a digital signal with a first conversion accuracy, and a second A/D conversion circuit that converts an analog signal into a digital signal with a second conversion accuracy which is higher than the first conversion accuracy, and wherein the standby control unit causes both the first A/D conversion circuit and the second A/D conversion circuit to return in returning in the PLL normal-oscillation mode, and causes the first A/D conversion circuit to return and holds the second A/D conversion circuit in the standby state when returning with the PLL self-oscillation mode.

4. The semiconductor device according to claim 3,
wherein the second region includes a first storage unit in which an oscillation stabilizing time in the PLL normal-oscillation mode can be set, a second storage unit in which an oscillation stabilizing time in the PLL self-oscillation mode can be set, a selection circuit for selecting information stored in the first storage unit and information stored in the second storage unit according to the information held in the information holding unit, and an oscillation stabilizing time wait counter for keeping an oscillation stabilizing time based on the information selected by the selection circuit.

5. The semiconductor device according to claim 4, further comprising an external terminal which can determine, regardless of the information held in the information holding unit, the operation mode of the PLL circuit when the first region has returned from the power-down state to the power-supply state.

6. An automobile control system comprising a semiconductor device according to claim 5.

* * * * *